United States Patent
Jang et al.

[11] Patent Number: 5,972,798
[45] Date of Patent: Oct. 26, 1999

[54] PREVENTION OF DIE LOSS TO CHEMICAL MECHANICAL POLISHING

[75] Inventors: Syun-Ming Jang, Hsin-Chu; Jui-Yu Chang, Tao-Yuan; Chen-Hua Yu, Hsin-Chu; Chung-Long Chang, Dou-Liu; Tsu Shih, Hsin-Chu; Jeng-Horng Chen, Taipei, all of Taiwan

[73] Assignee: Taiwan Semiconductor Manufacturing Company, Ltd., Hsin-Chu, Taiwan

[21] Appl. No.: 09/086,775

[22] Filed: May 29, 1998

[51] Int. Cl.[6] .................................................. H01L 21/00
[52] U.S. Cl. ...................... 438/717; 438/692; 438/691; 438/706; 438/712; 216/84
[58] Field of Search .................................. 438/691, 712, 438/692, 693, 706, 717, 694; 216/84

[56] References Cited

U.S. PATENT DOCUMENTS

| | | | |
|---|---|---|---|
| 5,271,798 | 12/1993 | Sandhu et al. | 156/638 |
| 5,362,669 | 11/1994 | Boyd et al. | 438/692 |
| 5,401,691 | 3/1995 | Caldwell | 430/317 |
| 5,503,962 | 4/1996 | Caldwell | 438/692 |
| 5,627,110 | 5/1997 | Lee et al. | 438/692 |
| 5,705,320 | 1/1998 | Hsu et al. | 438/712 |
| 5,795,825 | 8/1998 | Sugano | 438/691 |

*Primary Examiner*—Benjamin Utech
*Assistant Examiner*—Duy-Vu Deo
*Attorney, Agent, or Firm*—George O. Saile; Stephen B. Ackerman

[57] ABSTRACT

Described is a novel method for the formation of topological features during the processing of a semiconductor wafer into integrated circuit devices. The present invention is most useful for those processes used to form advanced multilevel ultra-large scale integrated circuits where global planarization techniques, such as chemical mechanical polishing, is used. The present invention is applicable to all processes used to form modern high density, multilevel integrated circuits and without respect of the number of layers formed or materials used. In the present invention, a substrate is a semiconductor wafer or portion thereof, and is the material on which the described processes alter and the layers are formed.

6 Claims, 7 Drawing Sheets

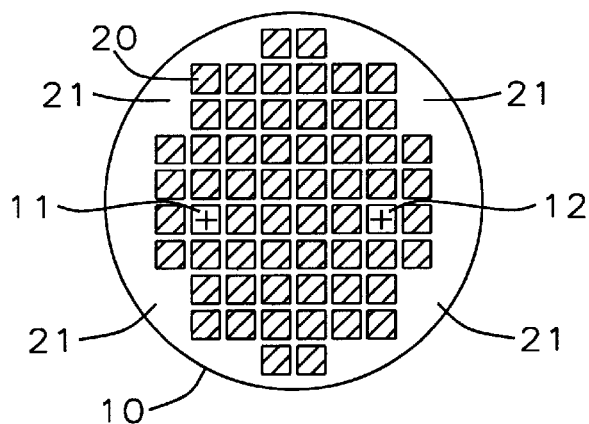
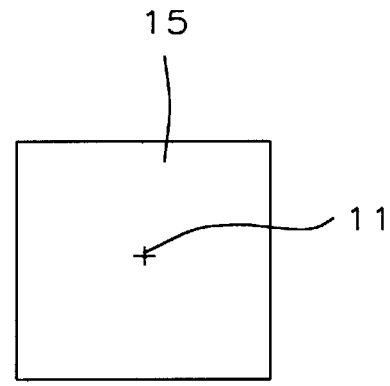
FIG. 1a – Prior Art
FIG. 1b – Prior Art
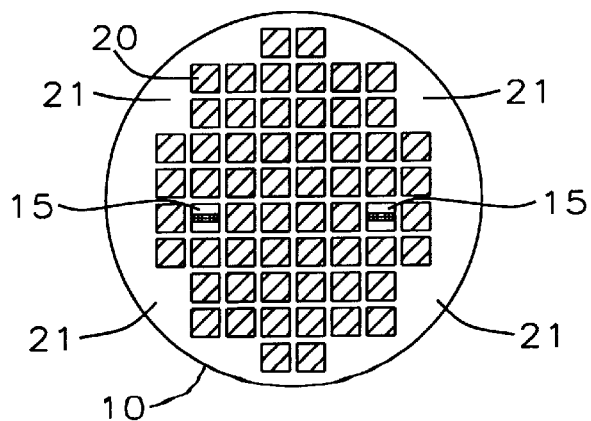
FIG. 2a
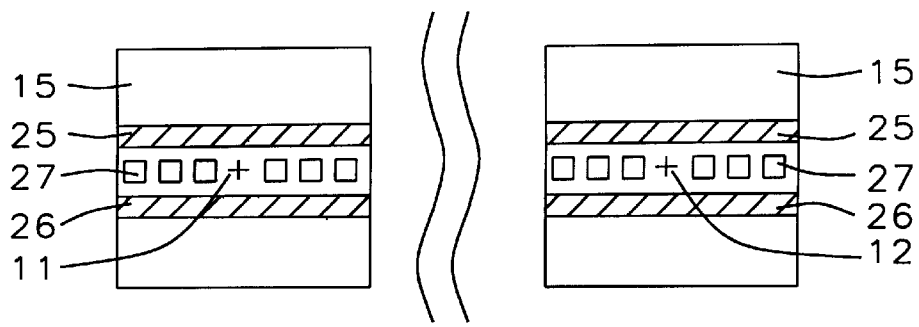
FIG. 2b

PREVENTION OF DIE LOSS TO CHEMICAL MECHANICAL POLISHING

BACKGROUND OF THE INVENTION (1) Technical Field

This invention relates generally to an apparatus and method for making integrated circuits and more particularly, the invention relates to methods that prevent die loss resulting from planarization using chemical mechanical polishing.

(2) Description of the Prior Art

The following four documents relate to methods dealing with chemical mechanical polishing of integrated circuits formed on semiconductor wafers.

U.S. Pat. No. 5,271,798 issued Dec. 21, 1993 to G. Sandhu et al., remedies the problems associated with selective etching of material, in particular tungsten, by locally removing the material, e.g. tungsten, from the alignment marks through wet etching without the need for any photo steps. Either before or after chemical mechanical polishing, the wafers are flatly aligned and a tungsten etching agent is introduced through an etching dispensing apparatus onto the alignment marks.

U.S. Pat. No. 5,362,669 issued Nov. 8, 1994 to J. Boyd et al., discloses a method of chemical mechanical polishing using polish stops in wide trenches.

U.S. Pat. No. 5,401,691 issued Mar. 28, 1995 to Caldwell, shows a method of forming an alignment mark using an inverse open frame.

U.S. Pat. No. 5,627,110 issued Lee et al. shows a method for eliminating a window mask process in the fabrication of a semiconductor wafer when chemical mechanical polish planarization is used.

The fabrication of integrated circuits on a semiconductor wafer involves a number of steps where patterns are transferred from photolithographic photomasks onto the wafer. The photomasking processing steps opens selected areas to be exposed on the wafer for subsequent processes such as inclusion of impurities, oxidation, or etching.

During the forming of integrated circuit structures, it has become increasingly important to provide structures having multiple metallization layers due to the continuing miniaturization of the circuit elements in the structure. Each of the metal layers is typically separated from another metal layer by an insulation layer, such as an oxide layer. To enhance the quality of an overlying metallization layer, one without discontinuities of other blemishes, it is imperative to provide an underlying surface for the metallization layer that is ideally planar. The process of planarizing is now a standard process application of integrated circuit manufacturers.

Plasma, or reactive ion etching of the oxide layers having a resist planarizing medium, are conventional planarization techniques that are used to provide a smooth surface and a local planarization with a range of 1 um.

To meet the demand for larger scale integration, and more metal and oxide layers in devices and the exacting depth of focus needed for submicron lithography, a new planarization method, known as chemical mechanical polishing (CMP), was developed and is presently used by most major semiconductor manufacturers. CMP planarization of a wafer involves supporting and holding the wafer against a rotating polishing pad wet with a polishing slurry and at the same time applying pressure. Unlike the conventional planarization techniques, CMP provides a substantially improved overall planarization, that is, an improvement of 2 to 3 orders of magnitude over conventional methods. Although CMP planarization is effective, die loss still occurs. Referring now to FIGS. 1a and 1b, the problem associated with present CMP planarization is a "high plateau" effect, surrounding alignment targets 11, 12 and the outside periphery 21 of the die array 20 which can cause a non-uniform polishing of the substrate surface. Stepping fields 15, 16 and 21 are skipped during alignment and exposure of substrate 10, the photoresist layers over blank stepping fields 15, 16 and 21 are never exposed during the process. Thus, all layers deposited on substrate 10 are always deposited over blank stepping fields 15, 16 and 21 but are never removed or etched away. The blank stepping fields 15, 16 and 21, therefore, consists of the worse case (highest) elevation structure on the wafer.

As noted, the build up of the deposited materials on the blank stepping fields 15, 16 and 21 appears to the polisher as a high plateau area. Since the area is large and flat, the polish rate of blank stepping fields 15, 16 and 21 is slow, like that of a blank wafer. The high plateau of the blank stepping fields lowers the polish rate of the edges of the IC die 20 which immediately surround blank stepping field 15, 16 and the wafers edge 21. The high plateau effect, therefore, can cause an unacceptable yield falloff on die which border blank stepping fields.

As a result, the prior art technique has difficulty in providing trouble free device patterns causing open contact or via and thus, causes a problem that the process margin in fabricating semiconductor devices is reduced, so as to lower production yield.

SUMMARY OF THE INVENTION

The present invention seeks to provide a method of forming integrated circuits using planarization by chemical mechanical polishing, which avoids the above-mentioned problem.

According to one aspect of the present invention, there is provided a novel process for preventing die losses that are contiguous to the die containing the alignment targets when a CMP planarization process is used. It is an object of the present invention to show how to use the immediate area surrounding the alignment targets for forming die topology to reduce the deleterious effects of open area polishing to the alignment target's neighboring devices during CMP planarization.

It is another object of the present invention to provide the method for making use of the immediate area surrounding the die array for forming die topology to reduce the deleterious effects of open area polishing to neighboring devices during CMP planarization.

It is still another object of the present invention to provide the method capable of high yield in fabricating a semiconductor device.

It is an additional object of the present invention to provide the method, useful in a semiconductor device having large scale integration.

Based on the intensive and thorough research and study by the present inventors, the above objects can be accomplished. In accordance with these aims and aspects, the present invention is concerned with providing a method for processing and forming integrated circuits on a wafer which is to have an array of integrated circuit dice and at least two of the dice reserved for alignment targets formed therein. The method of the invention includes the forming of topologic features adjacent the alignment targets and within its reserved die area, also, adjacent and surrounding the outer most dice of the integrated circuit dice array The topologic features will be included in the set of photomasks during the photolithographic process which opens selected areas for exposure for subsequent layering such as etching, oxidation, and metallization. The topologic features are also planarized during the CMP process. This novel approach "breaks-up" the otherwise open/unused areas adjacent IC dice thus preventing yield losses caused by CMP planarization. The topologic features are disposed between the alignment targets and IC die as illustrated in FIGS. 2a and 2b. The features comprise strips 25, 26 in the Y—Y direction and a plurality of clear-out windows in the X—X direction.

DESCRIPTION OF THE DRAWINGS

FIG. 1a is an illustration of an overhead view of a semiconductor wafer of the prior art.

FIG. 1b is an exploded view of a void stepping field of the prior art.

FIG. 2a is an illustration of an overhead view of a semiconductor wafer of the invention.

FIG. 2b is an exploded view of a void stepping field of the invention.

DETAILED DESCRIPTION OF THE PREFERRED EMBODIMENT

Figure 2C:
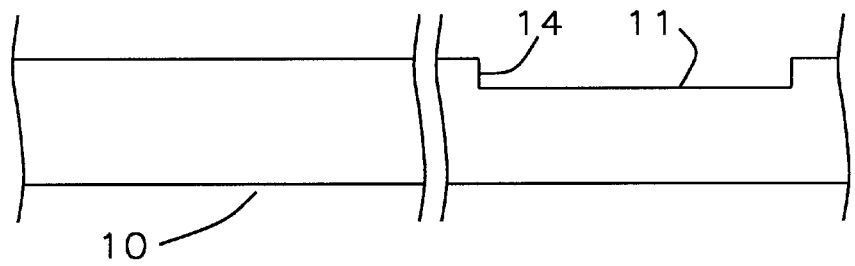
FIG. 2c is a partial and exploded view of a semiconductor wafer of the invention.

FIG. 2a, is a top view illustration of a processed semiconductor wafer 10 of the present invention. Wafer 10 has a multiplicity of integrated circuit devices 20 formed thereon. Each device 20, lies in a stepping array of a stepper which exposes patterns on the wafer's photoresist that is used for forming the integrated circuit layers. Wafer 10 has at least one, and typically two void stepping fields 15 and 16. A void stepping field is a die area which is skipped during the stepper exposure excursion. There are typically a multiplicity of integrated circuit devices 20 which surround each void stepping field.

Within each void stepping field 15 and 16, see FIG. 2b, is an alignment target 11 and 12, respectfully. The alignment targets 11 and 12 are typically a small cross pattern (a couple hundred microns) formed near the center of each void stepping field 15 and 16, and is extremely small in relation to the void stepping fields.

Alignment target 11 and 12 are formed by etching a controlled distance into the wafer 10. The etching step forms a step height 14 in the wafer 10. The step height 14 functions as an alignment mark, permanently engraved in the wafer 10. Step height 14 of alignment target 11 is generally made to be some multiple, typically ¼, of the wavelength of the laser light used by the stepper to do the alignment. This gives the ideal signal to noise ratio of the laser diffraction pattern resulting in an optimum alignment condition.

Next, subsequent layers used to form the integrated circuit devices 20 are grown and deposited over the wafer. Although the original alignment marks, 11 and 12 are covered by subsequent layers, i.e., field isolation, polysilicon, interlayer dielectrics, and the like, the step height of the alignment marks are covered by subsequent layers, the step height is replicated in the subsequently deposited layers. The replicated alignment targets are used for aligning and patterning the subsequent layers. That is, as more layers are added to the array of integrated circuit devices, the step height of the alignment targets is propagated upward or is formed upward with subsequent layers. The step height of the alignment targets is therefore preserved in subsequent layers so that alignment of subsequent layer can be accomplished.

Figure 3:
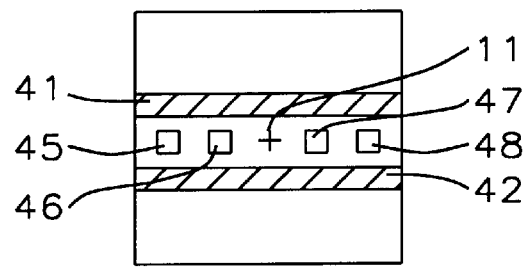
FIG. 3 illustrates a photomask reticle having the topological features of the invention.

The problem associated with "high plateau" planarization is overcome by the present invention. After contact alignment and exposure of the integrated circuit devices, a separate reticle having features illustrated in FIG. 3, is used to expose the area immediately surrounding the alignment target 11 The reticle pattern comprises a pair of dummy dice 41, 42 and clear-out 1.6×1.6 mm windows 45, 46, 47 and 48 as buffer topology. The reticle is used to expose the void stepping fields 12 and 13 immediately surrounding the alignment target and can then be etched away during the etching process. The area immediately surrounding the alignment target will be broken up into smaller plots thereby increasing the polishing rate, hence, effecting a more uniform planarization process. This is substantiated in the eight pairs of test cases presented in FIGS. 4a, 4b, 4c, 5a, 5b, 5c, 6a and 6b.

Figure 4A:
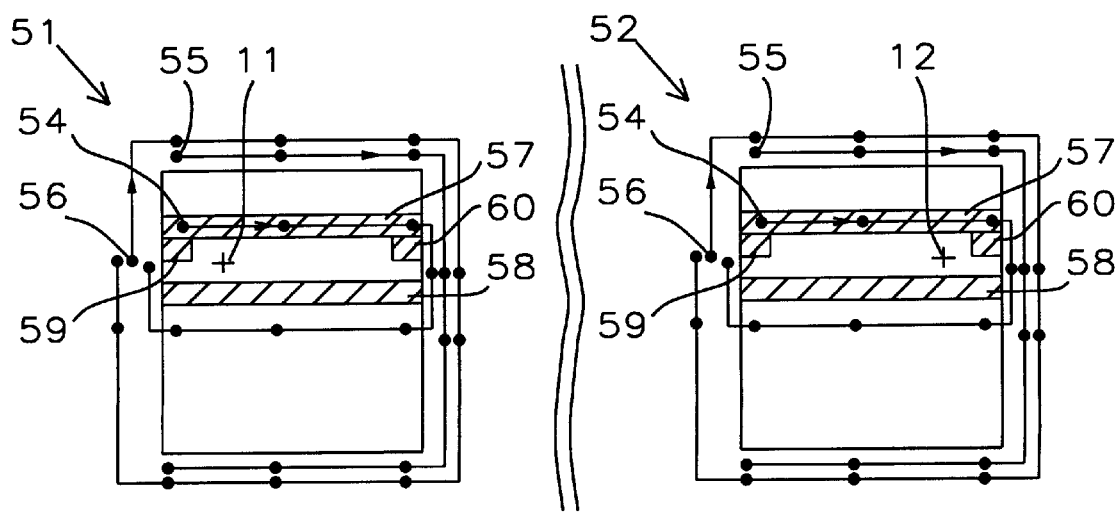
FIG. 4a illustrates a top view of a test sample having a left and a right alignment target die of the invention.
Figure 4B:
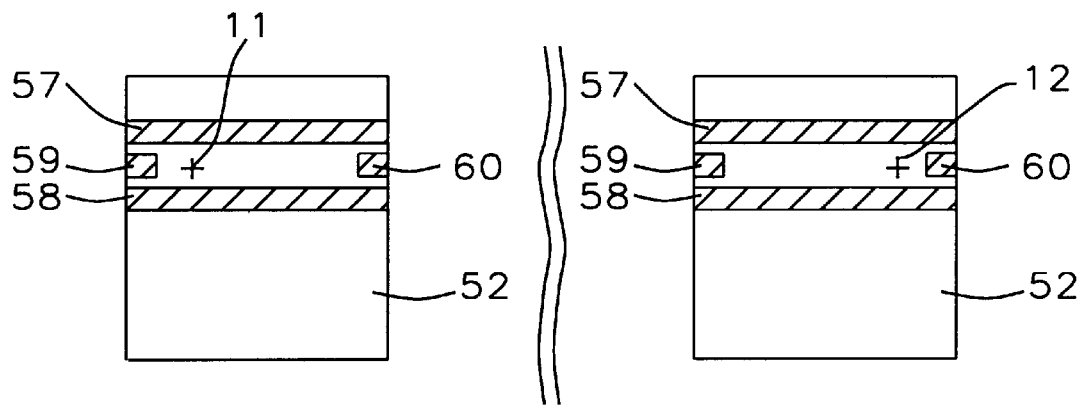
FIG. 4b illustrates a top view of a test sample having a left and a right alignment target die of the invention.
Figure 4C:
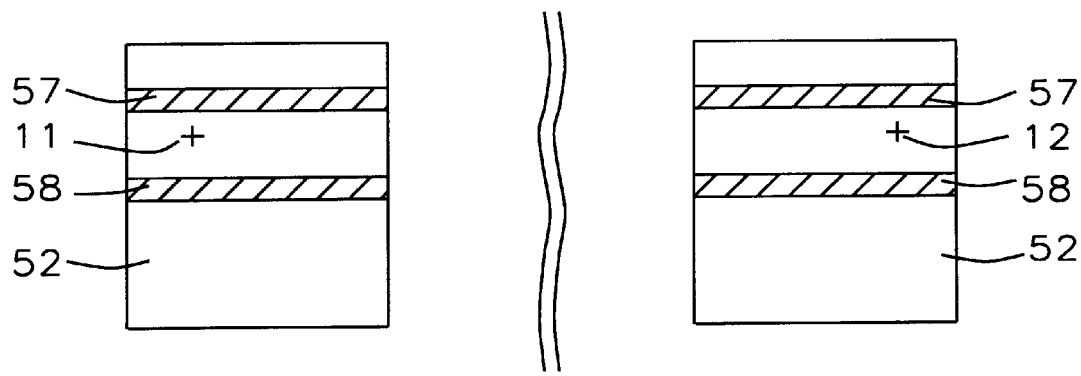
FIG. 4c illustrates a top view of a test sample having a left and a right alignment target die of the invention.
Figure 5A:
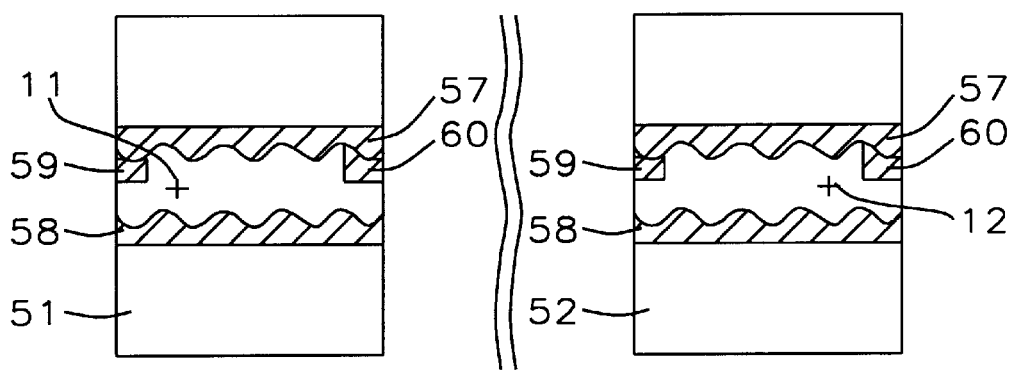
FIG. 5a illustrates a top view of a test sample having a left and a right alignment target die of the invention.
Figure 5B:
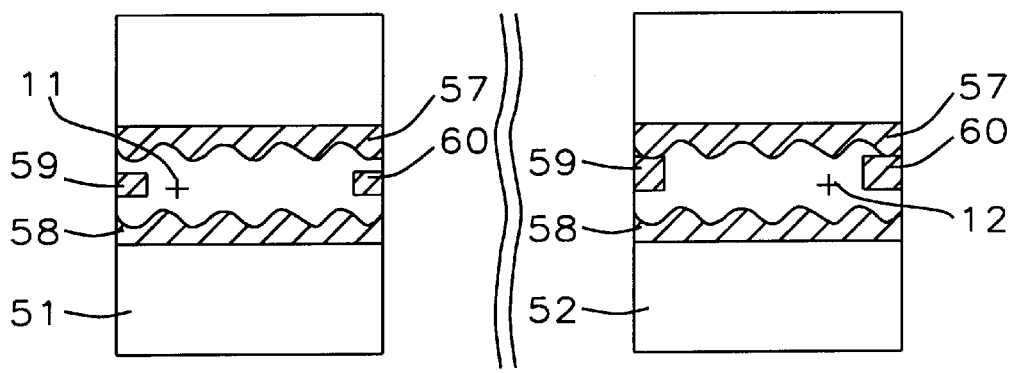
FIG. 5b illustrates a top view of a test sample having a left and a right alignment target die of the invention.
Figure 5C:
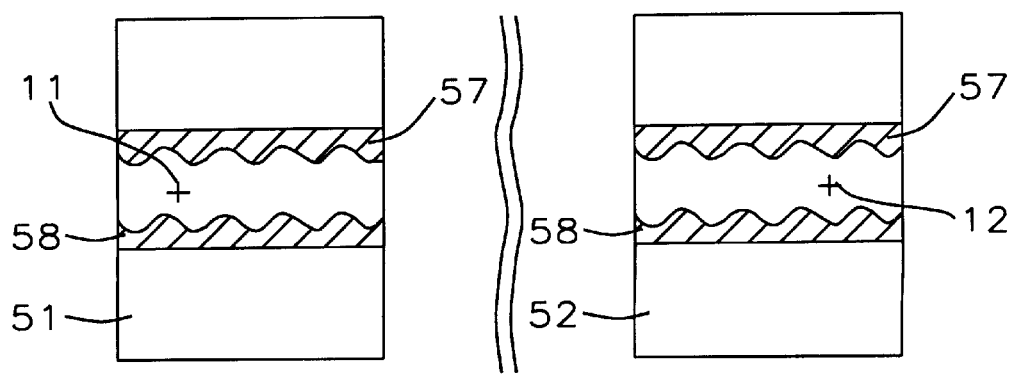
FIG. 5c illustrates a top view of a test sample having a left and a right alignment target die of the invention.
Figure 6A:
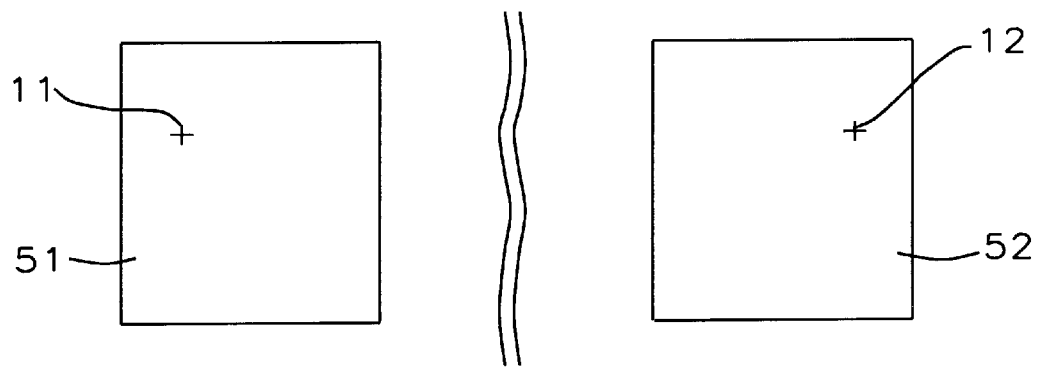
FIG. 6a illustrates a top view of a test sample having a left and a right alignment target die of the invention.
Figure 6B:
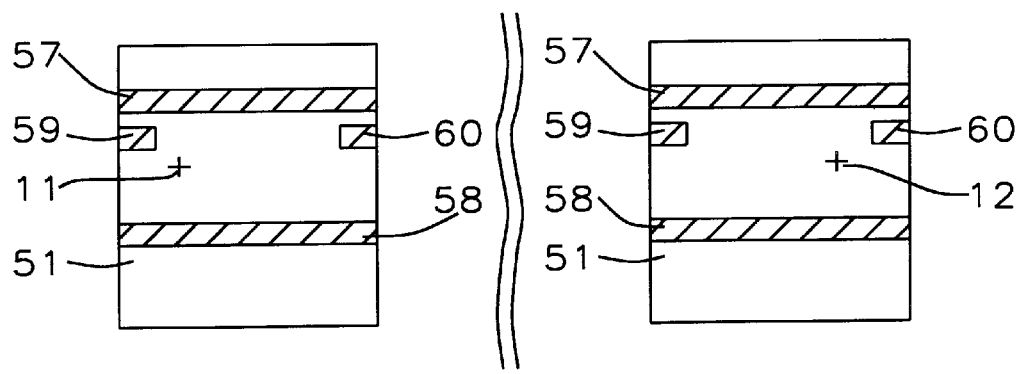
FIG. 6b illustrates a top view of a test sample having a left and a right alignment target die of the invention.

The pair shown in FIG. 4a illustrates an enlarged and simulated die field 51 and 52 having dimensions of 19.31 mm×22.17 mm. An alignment target 11 is disposed to the upper left side of the left die field 51 and an alignment target 12 disposed to the upper right side of the right die field 52. All of the remaining pairs, illustrated in FIGS. 4b, 4c, 5a, 5b, 5c, 6a and 6b, have the same left and right field orientation and measurement paths. The measurement paths include three loops 54, 55, and 56 for both left and right die fields. Each loop has measurement points that are sequentially numbered in a clockwise direction. Inner loop 54 includes measurement points 1 through 8, loop 55 includes measurement points 9 through 16 and loop 56 includes measurement points 17 through 27. The dummy die areas 57, 58 and clear out windows 59, 60 shown cross-hatched, and included in most of the test cases represent areas that are at different elevations with respect to its neighboring, noncross-hatched regions. The dummy die areas of test cases shown in FIGS. 4a, 4b, and 4c, are disposed equal distant from alignment targets 11,12 with a spacing of 3 mm between them. In FIG. 4a, clear out windows 59, 60 in both left and right die, are disposed at the left and right edges of the die field and contiguous to the upper dummy die 57. In FIG. 4b, the clear out windows are placed at the left and right edges of the die field and at a center location relative to the dummy dice. FIG. 4c has only the dummy dice 57, 58 without clear out windows. In test cases illustrated in FIGS. 5a, 5b, and 5c, the dummy dice are patterned with a wavy inner dice edge while the clear-out windows follow the same pattern as in FIGS. 4a, 4b, and 4c. The remaining two test cases illustrated in FIGS. 6a and 6b are the extreme. FIG. 6a is formed without dummy dice or clear-out windows. FIG. 6b is similar to FIG. 4a, the only difference of 8 mm spacing between the dummy dice 57 and 58.

Figure 7:
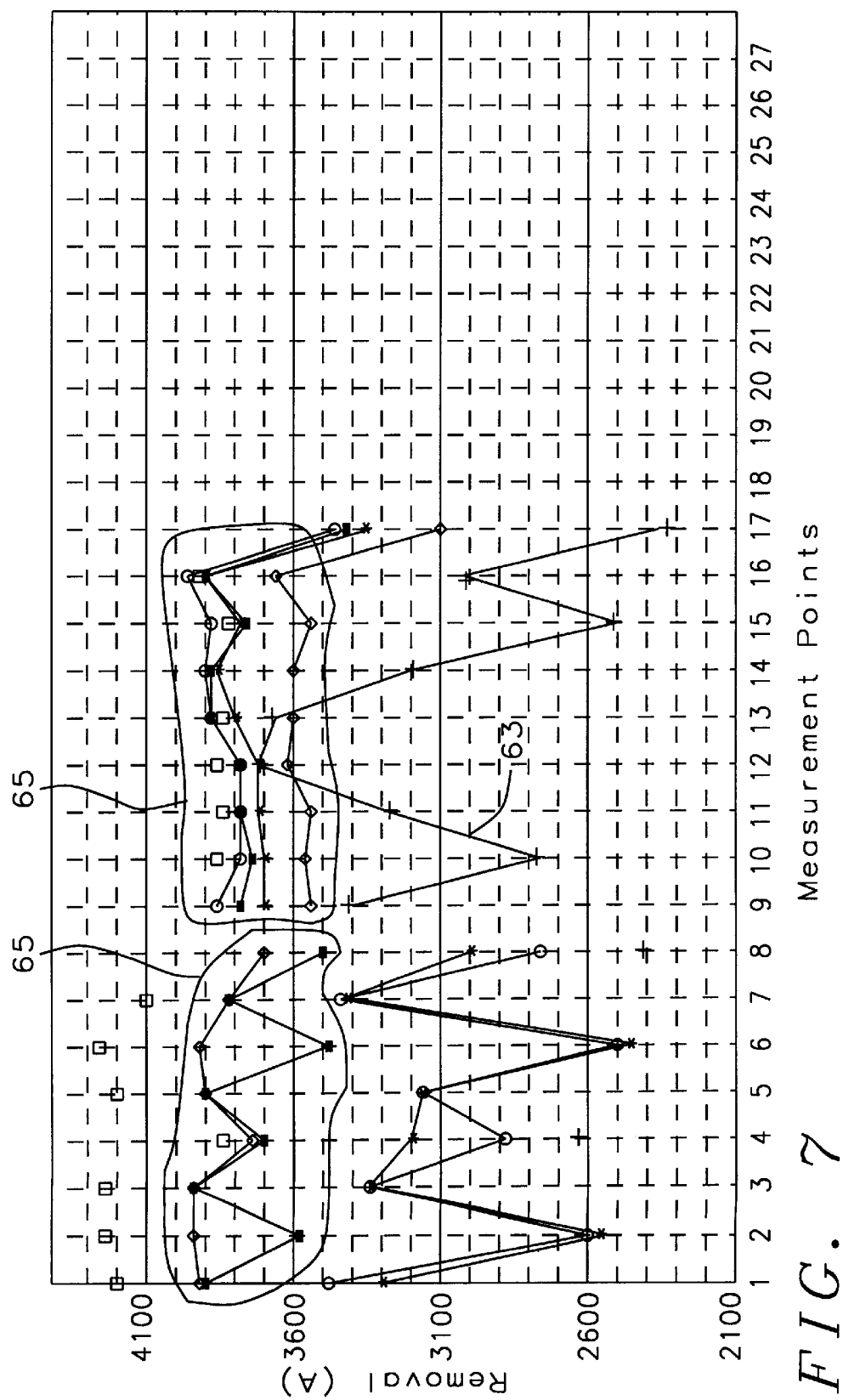
FIG. 7 shows plots of die thickness before CMP planarization for the left alignment target for each test sample shown in FIGS. 4a, 4b, 4c, 5a, 5b, 5c, 6a and 6b of the invention.
Figure 8:
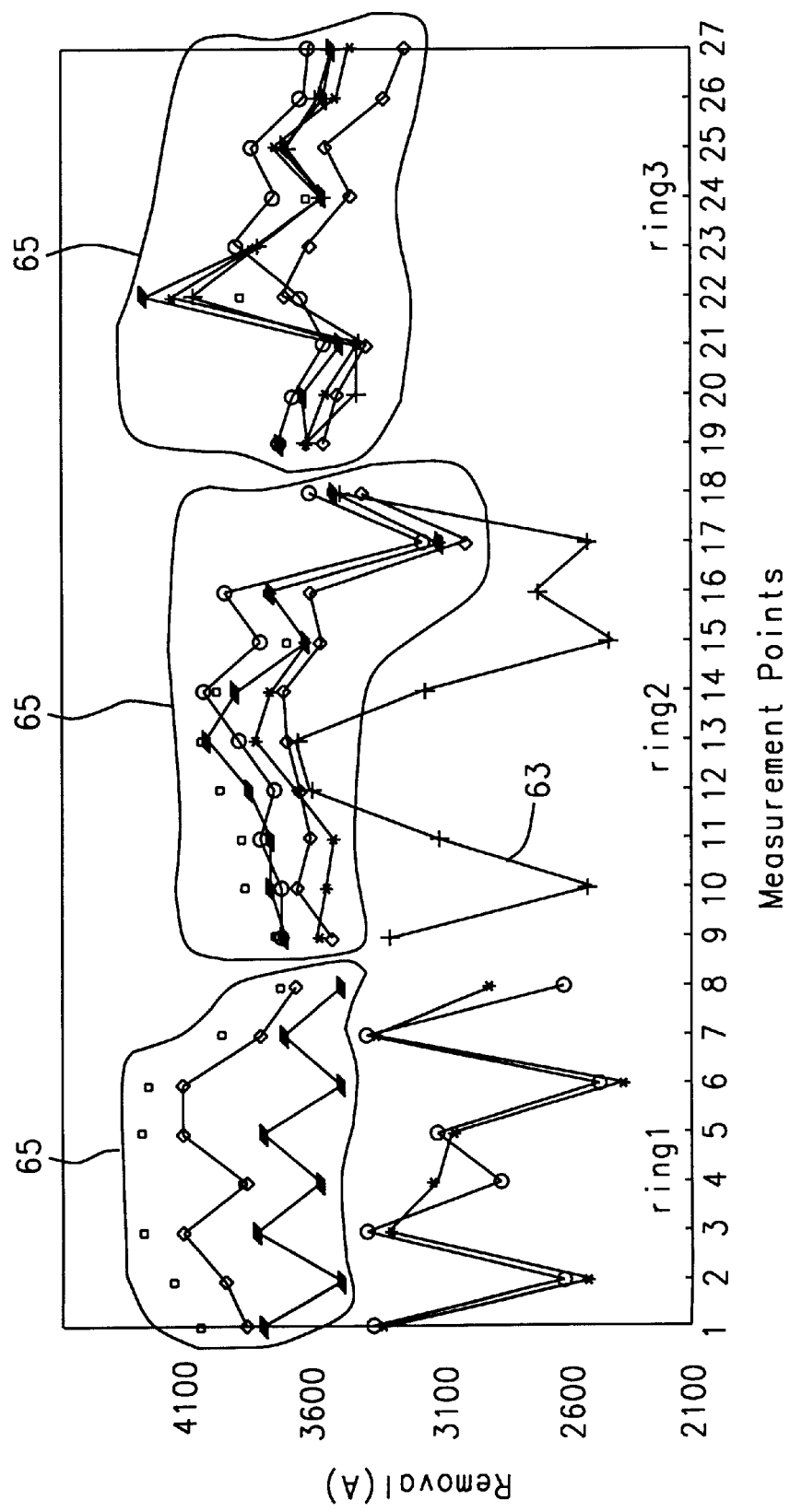
FIG. 8 shows plots of die thickness before CMP planarization for the right alignment target for each test sample shown in FIGS. 4a, 4b, 4c, 5a, 5b, 5c, 6a and 6b of the invention.

FIG. 7 maps the thickness (in angsrom units) of the left die field test cases prior to planarization. FIG. 8 maps the thickness (in angstrom units) of the enlarged right die field test cases prior to planarization. It is visibly obvious, in both FIGS. 7 and 8, that the greatest variance shows up in test case 63, FIG. 6a, where a large flat area exists without any formed topological features other than the alignment mark. The least variance shows up in all the other test cases 65.

Thus, a process has been described for reducing die losses during planarization by chemical mechanical polishing. The invention is concerned with improvements to the die with large open areas such as those containing only alignment targets or the like.

While the invention has been particularly shown and described with reference to the preferred embodiments thereof, it will be understood by those skilled in the art that various changes in form and details may be made without departing from the spirit and scope of the invention.

What is claimed is:

1. A method for forming dummy die features adjacent alignment targets on a semiconductor substrate, said method comprising the steps of:

providing a semiconductor substrate with alignment targets etched within two dedicated dice contained within a device array formed on the semiconductor substrate;

applying and baking a photoresist coating on said semiconductor substrate's top surface;

aligning and exposing said device array with an integrated circuit reticle pattern; and skipping over and not exposing said dedicated dice;

replacing said integrated circuit reticle pattern with a second reticle containing dummy die features, said second reticle is used to pattern the area surrounding the alignment target within each dedicated die, said dummy die features include a plurality of rectangular windows with spaces between, said plurality of rectangular windows organized in separate linear patterns and are placed surrounding said alignment targets;

exposing said dedicated dice with second reticle containing dummy die features; developing and baking said exposed photoresist for opening windows in said photoresist for forming integrated circuits and dummy die features; stripping photo resist after layering and repeating said photolithographic processes for forming additional layer and for CMP planarization.

2. A method according to claim 1 wherein said reticle containing dummy die features masks the alignment targets to prevent exposure of said photoresist immediately covering said alignment targets.

3. The method according to claim 1 wherein said reticle containing dummy die features opens windows in said dedicated dice area immediately surrounding said alignment targets to permit etching and deposition of materials within said open windows.

4. The method according to claim 1 wherein said forming of dummy die features within said dedicated dice breaks up a predominately open area immediately surrounding said alignment target dice and increases polishing rate of said dedicated die during chemical mechanical polishing.

5. The method according to claim 1 wherein forming of 40 dummy die features within said dedicated dice increases the polishing rate during chemical mechanical polishing such that planarization is normalized over said device array including said dedicated dice.

6. The method according to claim 1 whereby forming of dummy die features within said dedicated dice reduces yield loss during planarization using chemical mechanical polishing techniques.

* * * * *